United States Patent
Finkel et al.

(10) Patent No.: US 9,048,762 B1
(45) Date of Patent: Jun. 2, 2015

(54) ENERGY HARVESTING UTILIZING STRESS INDUCED PHASE TRANSFORMATION IN FERRO-ELECTRIC PIEZOCRYSTALS

(71) Applicants: Peter Finkel, Andover, MA (US); Ahmed H Amin, North Attleboro, MA (US); Colin J Murphy, Newport, RI (US); Christopher S Lynch, Sherman, CA (US); Wen D Wong, Los Angeles, CA (US)

(72) Inventors: Peter Finkel, Andover, MA (US); Ahmed H Amin, North Attleboro, MA (US); Colin J Murphy, Newport, RI (US); Christopher S Lynch, Sherman, CA (US); Wen D Wong, Los Angeles, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 293 days.

(21) Appl. No.: 13/826,109

(22) Filed: Mar. 14, 2013

(51) Int. Cl.
*H01L 41/187* (2006.01)
*H02N 2/18* (2006.01)
*H01L 41/18* (2006.01)
*H02N 2/00* (2006.01)

(52) U.S. Cl.
CPC .............. *H02N 2/18* (2013.01); *H01L 41/18* (2013.01); *H02N 2/009* (2013.01); *H01L 41/187* (2013.01)

(58) Field of Classification Search
CPC .............. H01L 41/187; H01L 41/1875; H01L 41/1876
USPC ................ 310/358, 339; 252/62.9 R, 62.9 PZ
See application file for complete search history.

(56) References Cited

U.S. PATENT DOCUMENTS

2007/0267947 A1* 11/2007 Matsushita et al. ........... 310/358

* cited by examiner

*Primary Examiner* — Derek Rosenau
(74) *Attorney, Agent, or Firm* — James M. Kasischke; Michael P. Stanley

(57) ABSTRACT

A transducer for generating electrical energy from an expected force includes a single crystal ferroelectric material having a phase transition stress level. Mechanical stress is provided to this crystal at a level approaching the phase transition stress level, such that the expected external force will cause the phase transition. At least two electrodes are joined to the single crystal for receiving electrical energy created by the phase transition. The electrodes can be joined to conditioning and storage circuitry. In further embodiments, the phase transition is induced by an expected temperature change.

20 Claims, 3 Drawing Sheets

ENERGY HARVESTING UTILIZING STRESS INDUCED PHASE TRANSFORMATION IN FERRO-ELECTRIC PIEZOCRYSTALS

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

This application claims the benefit of U.S. Provisional Application No. 61/756,542, filed on Jan. 25, 2013, which is a continuation-in-part of U.S. patent application Ser. No. 13/053,577, filed on Mar. 22, 2011, and entitled "Crystalline Relaxor-Ferroelectric Phase Transition Transducer."

BACKGROUND OF THE INVENTION (1) Field of the Invention

The present invention is directed generally towards energy harvesting utilizing ferroelectric piezocrystal material transducers, and in particular, to a ferroelectric generator that utilizes a crystalline phase transformation to achieve higher energy density.

(2) Description of the Prior Art

While piezoelectric materials have been successfully utilized in sensors and actuators, their use as practical power sources for generating a useful amount of electricity in portable generators has been limited by the small amounts of power available and the efficiency of generating this power. Most practically applied piezoelectric energy harvesting is performed by piezoelectric composite materials. These materials incorporate a plurality of piezoelectric crystals in a matrix material. Efficiency is limited by the matrix material, coupling inefficiencies and crystal orientations.

Single crystal ferroelectric materials are also known in the art for energy harvesting. While more efficient than composite materials, these materials operate in the linear region of the ferroelectric response curve because the linear region is the operating region without pre-stress or bias electric field.

The current most promising class of materials for energy harvesting are relaxor-ferroelectric single crystals. These materials are single crystals of ferroelectric materials (for example, lead zinc niobate-lead titanate, known hereinafter as PZN-PT). These materials have been shown to deliver a high voltage at greater efficiency when the crystal is subjected to stress. In some special compositions (for example certain compositions of ternary lead indium niobate-lead magnesium niobate-lead titanate (PIN-PMN-PT)), the material will undergo a phase transformation accompanied by a very sharp hysteretic strain and a dramatic change in stiffness when subjected to external stress. This phase transformation can be invoked repeatedly at variable rates to induce large strains in the single crystal element. Known compositions exhibiting this type of phase change behavior include (1-x)PZN-xPT where $0.04 < x < 0.11$. The composition where x was 0.06 has been tested at multiple temperatures and applied direct current (DC) bias fields. Under these conditions, it has been shown to exhibit a phase transformation.

It is known to combine single crystal piezoelectric materials with mechanical stress inducing means. This is typically performed in order to avoid putting the piezoelectric material in tensile stress because of the fragility of ceramic or single crystal materials in tension. In a prior art mechanically induced stress application, the stress is calculated to be that which is optimal for insuring piezoelectric material life in the operating conditions of the application. These operating conditions can include varying environmental temperatures and pressures.

It is also known to include an electrically controllable stress element in combination with a piezoelectric single crystal material. This element can be either a piezoelectric (voltage driven) element or a magnetostrictive effect (MS) element. These hybrid magnetostrictive-piezoelectric transducer systems are known to work effectively in a linear region.

In both mechanical and electrical stress generation means, applications avoid utilizing stress near the phase transition stress level of relaxor ferroelectric single crystals.

SUMMARY OF THE INVENTION

It is an object of the present invention to provide an efficient energy harvesting apparatus for a known force change.

It is a further object of the present invention to provide an efficient energy harvesting apparatus for a known temperature change.

Accordingly, there is provided a transducer for generating electrical energy from an expected external force that includes a single crystal ferroelectric material having a phase transition stress level. Mechanical stress is provided to this crystal at a level approaching the phase transition stress level, such that the expected external force will cause the phase transition. At least two electrodes are joined to the single crystal for receiving electrical energy created by the phase transition. The electrodes can be joined to conditioning and storage circuitry. In further embodiments, the phase transition is induced by an expected external temperature change.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

This invention utilizes single crystal ferroelectric materials, known more specifically as relaxor-ferroelectric single crystal compositions, which operate near the morphotropic phase boundary (MPB). In these types of crystals, the morphotropic phase boundary is the temperature/pressure region in which the crystalline structure changes from a rhombohedral structure to a tetragonal structure through intermediate states.

Binary materials showing this transition include $Pb(B'_{1/3}Nb_{2/3})O_3$—$PbTiO_3$ where B' is one metal selected from the set of metals including Mg, Mn, Zn, and Sc. Ternary single crystal compositions, such as $xPb(In_{1/2}Nb_{1/2})O_3$-$(1-x-y)Pb(Mg_{1/3}Nb_{2/3})O_3$-$yPbTiO_3$ (PIN-PMN-PT), also show these properties. Useful crystals in this group have been found where x is in the range of about 0.24-0.33 and y is in the range of about 0.28-0.33. Other ranges and similar compositions of binary and ternary crystals may have beneficial properties.

Figure 1:
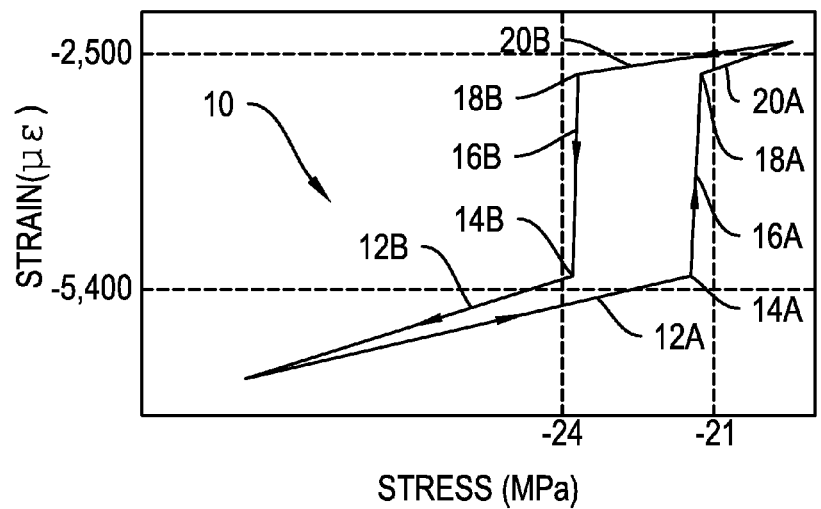
FIG. 1 is a graph showing strain versus stress for a representative phase change piezoelectric material.

FIG. 1 is a graph that generically depicts a hysteresis curve 10 of a single crystal material having a sharp elastic instability near the phase transition point. As compressive stress increases in the material, strain response increases linearly in region 12A. A phase transition point occurs at 14A. During phase transition the response is shown as indicated at 16A. Strain response is rapid during phase transition. The phase transition completes as indicated at 18A and a second linear region begins as indicated at 20A. As compressive stress is reduced, strain declines linearly in region 20B. Once stress declines sufficiently, a phase transition occurs at 18B. The response during phase transition is shown at 16B, and phase transition completes at 14B. The response enters the linear region at 12B as stress declines further. For a given material, the position of this curve and its inflection points depend on pressure, temperature and the electrical field to which the material is subjected. In one known material, this compressive pre-stress occurs in the region between about 24 MPa and 21 MPa as indicated in the FIG. The resulting microstrain (με) is between -2,500 and -5,400 as shown in the FIG. The critical stress is a characteristic of the particular material composition, and it can be determined experimentally for a given temperature and operating condition.

Figure 2A:
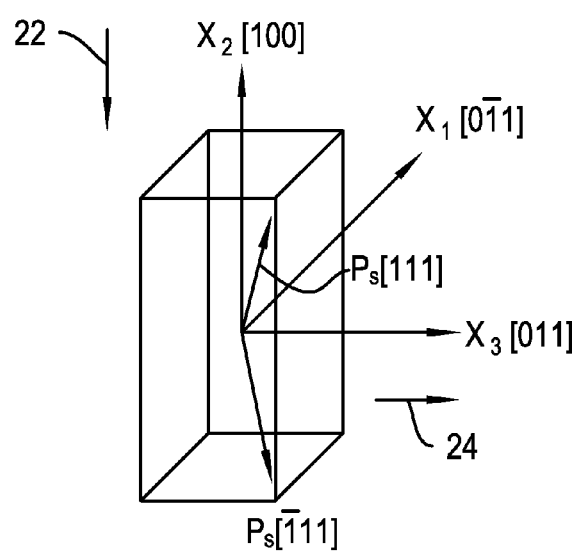
FIG. 2A is a perspective view of a first crystal orientation of a phase change piezoelectric crystal operating in the "32" mode.
Figure 2B:
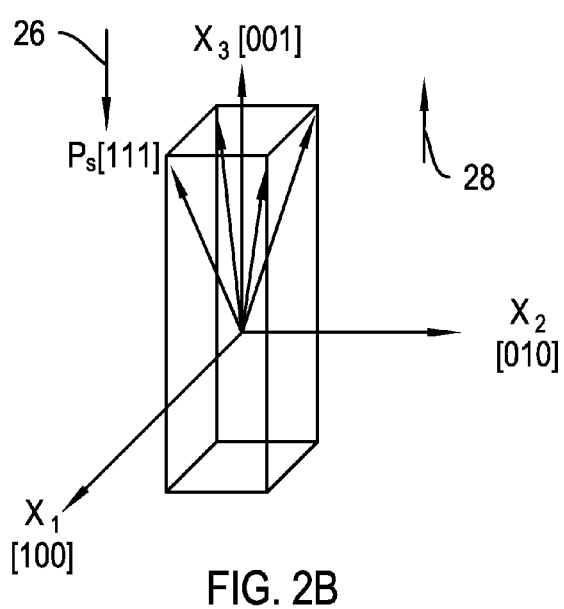
FIG. 2B is a perspective view of a second crystal orientation of a phase change piezoelectric crystal operating in the "33" mode.

Ferroelectric relaxor single crystals can be used to provide an electrical response when subjected to stress in the "32" mode or in the "33" mode. FIG. 2A shows crystal orientation for stress in the "32" mode, and FIG. 2B shows crystal orientation for stress in the "33" mode. In FIG. 2A, stress $\sigma_{22}$ and strain $\epsilon_{22}$ occur in the direction indicated by arrow 22. The $X_1$ axis is in the direction given by the vector $[0\bar{1}1]$. The $X_2$ axis is in the direction given by the vector [100], and the $X_3$ axis is in the direction given by the vector [011]. The arrows indicated by $P_s$ and vector directions $[\bar{1}11]$ and [111] show possible polarization vectors for these materials driven in the "32" mode. Strain in direction 22 is responsive to an electric field in the direction indicated by arrow 24.

FIG. 2B shows a piezoelectric crystal driven in the "33" mode having stress $\sigma_{33}$ and strain $\epsilon_{33}$ in the direction indicated by arrow 26. This is in response to an electric field generated in the direction indicated by arrow 28. The crystal has axes $X_1$ in the direction given by the vector [100], $X_2$ in the direction given by [010], and $X_3$ in the direction [001]. Possible polarizations are indicated at the vectors identified as $P_s$ in directions [111], $[1\bar{1}1]$, $[\bar{1}11]$, and $[\bar{1}\bar{1}1]$.

Figure 3:
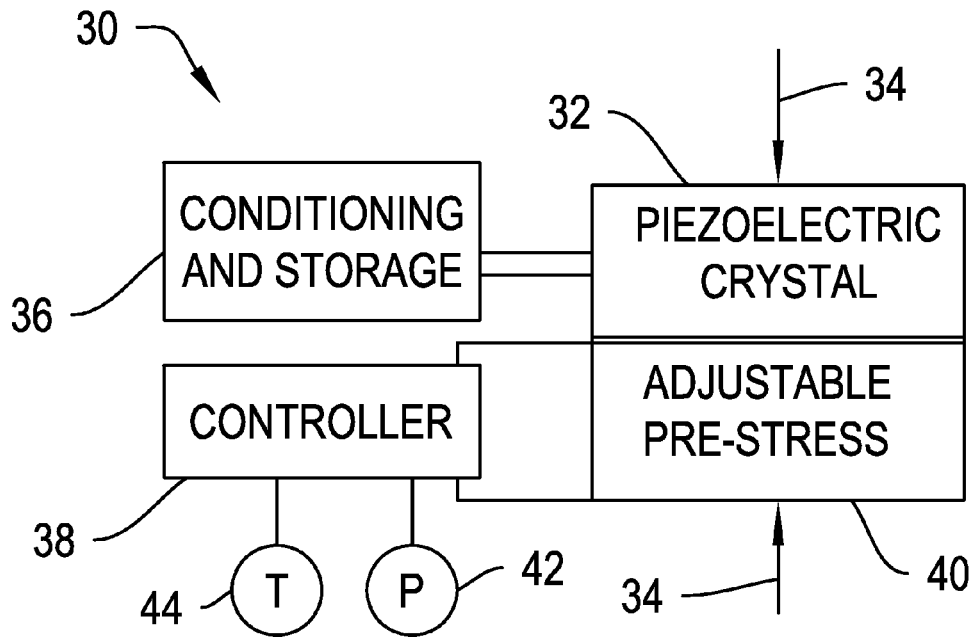
FIG. 3 is a diagram of an apparatus utilizing a phase change crystal for energy harvesting with a controller and an electronically adjustable pre-stress.

FIG. 3 provides a schematic for an energy harvesting device 30 according to one embodiment. A relaxor-ferroelectric single crystal 32 is positioned having a pre-stress indicated by arrows 34. Crystal 32 harvests energy from an additional fluctuating stress in the same direction 34. Crystal 32 can also harvest energy from a slight environmental temperature change that results in a phase transition. Crystal 32 has electrodes disposed thereon and joined to a conditioning and storage device 36. Conditioning and storage device 36 can be any electronic circuitry capable of transforming transient voltage provided by crystal 32 into a useful form. In other embodiments conditioning and storage device 36 can be an electrical load directly joined to crystal 32. The electrodes can be connected in either a "33" mode wherein the electric field is produced in the same direction as the strain or in a "32" mode wherein the electric field is produced orthogonal to the strain.

Device 30 can further include a controller 38 and a device 40 giving an adjustable pre-stress. Pre-stress device 40 is in series with crystal 32 and other pre-stress means. Device 40 can be a mechanical, piezoelectric, magnetostrictive or other device known in the art that is capable of contracting or expanding in response to a control signal. Insulating material can be positioned between pre-stress device 40 and crystal 32. Controller 38 can also be joined to a pressure sensor 42 and a temperature sensor 44. Pressure sensor 42 and temperature sensor 44 are positioned to detect environmental conditions affecting crystal 32. Controller 38 can provide a signal to adjustable pre-environmental conditions. This allows controller 38 to create a pre-stress in crystal 32 that is calculated based on the environmental conditions to it near the phase transition point indicated at 16 or 18 of FIG. 1. The calculated pre-stress can be based on experimental data or theoretical information related to the single crystal or the crystalline composition.

Figure 4:
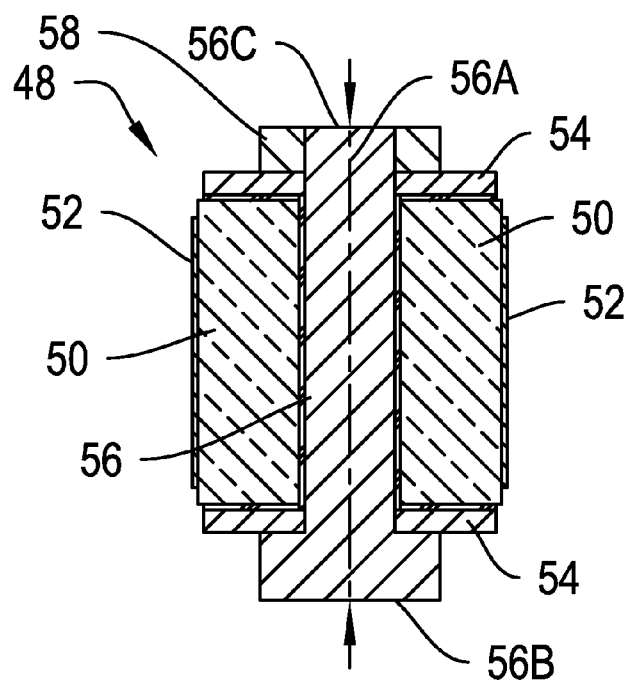
FIG. 4 is a cross-sectional view of an embodiment of a phase change transducer utilizing a mechanical pre-stress.

FIG. 4 shows an embodiment of the mechanical arrangement of an energy harvesting device 48 capable of creating a mechanical pre-stress in a transducer crystal 50. This embodiment shows a "32" mode transducer. Electrodes 52 are positioned on opposing sides of crystal 50. Electrodes 52 can be joined to a load (not shown). Crystal 50 is positioned between stress plates 54. A stress bolt 56 having an axis 56A is positioned to compress stress plates 54. Bolt 56 has a head 56B at a first end and threads 56C at a second end. Compression can be adjusted by a nut 58 positioned on threaded end 56C of stress bolt 56. Tension in bolt 56 results in an adjustable pre-stress in crystal 50. Crystal 50 and electrodes 52 should be insulated from plates 54 and bolt 56, if these items are conductive.

In "32" mode operation, an increase or decrease in the tension in bolt 56 causes a phase change in crystal 50 and generates an electric field between electrodes 52. Because piezoelectric materials are reciprocal, a change in stress applied along axis 48A also results in an electrical field being generated between electrodes 44. This results in positive or negative strain along axis 48A of bolt 48.

Figure 5:
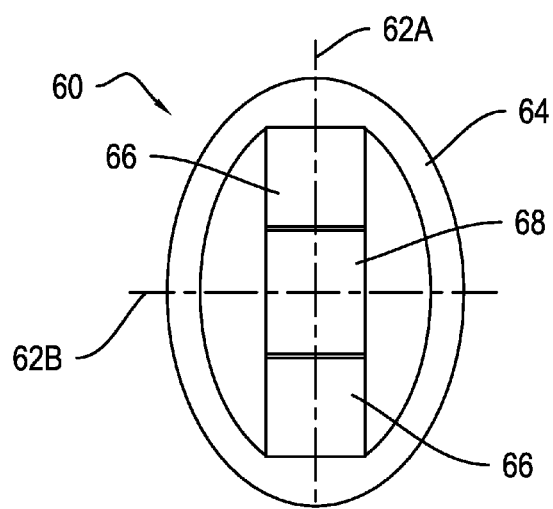
FIG. 5 is a diagram of a phase change transducer configured as a flextensional transducer.

FIG. 5 shows another embodiment of the current invention. This embodiment shows the apparatus formed as a flextensional type of transducer 60 for harvesting energy. Small displacements along the semi-major axis 62A result in large displacements along the semi-minor axis 62B providing an efficient low frequency transducer. In flextensional transducer 60, a flexing shell 64 acts as the mechanical pre-stress. The resonance frequency of transducer is determined by the flexing shell 64 size and material. Phase change crystals 66 are positioned in series with an electrically controllable, pre-stress component 68. Pre-stress component 68 can be a magnetostrictive transducer or a separately controlled piezoelectric transducer.

For high strain, phase change operation, flexing shell 64 applies a static stress to the single crystals 66 by way of the shell's 64 elasticity. This compressive stress brings the single crystals 66 close to the phase transition point. To generate energy, tension in the shell 64 along axis 62B provides a compressive stress along axis 62A that causes the single crystals 66 to change state. Releasing this stress causes crystals 66 to return to the original state. The required dynamic stress is related to how close the static stress can come to the phase transition point and remain stable. The crystals 66 can be brought closer to phase transition point by pre-stress component 68. Pre-stress component 68 can adjust static stress as needed, for example, to compensate for changes in pressure and temperature that would affect the shell's 64 compressive load.

Figure 6:
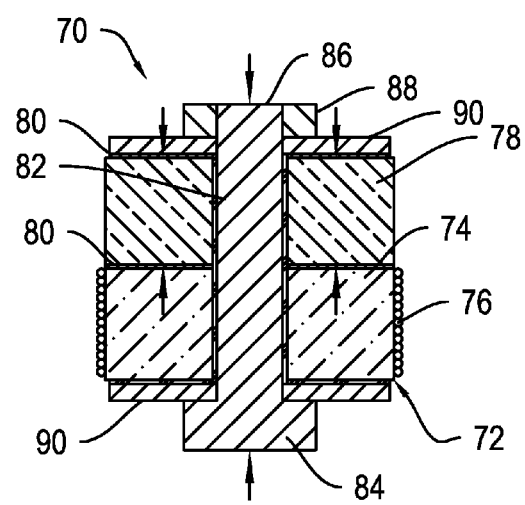
FIG. 6 is a diagram of a phase change transducer configured as a Tonpilz transducer employing mechanical pre-stress, adjustable electronic pre-stress and a single piezoelectric crystal.

FIG. 6 shows a cross-sectional view of another transducer 70 utilizing a Tonpilz configuration with a magnetostrictive pre-stress component 72. Magnetostrictive pre-stress component 72 can be a magnetostrictive material 74 (i.e., terfenol or galfenol) positioned within a solenoid coil 76. Using a variable current source, solenoid coil 76 can provide a magnetic field which acts on the magnetostrictive material 74 to induce a static stress. Magnetostrictive pre-stress component 72 is joined to a piezoelectric phase change single crystal 78. Electrodes 80 are positioned to receive an electric field generated by single crystal 78 when subjected to strain in the electric field direction. This provides a "33" mode piezoelectric transducer energy harvesting device. Mechanical pre-stress is applied to magnetostrictive pre-stress component 72 and phase change single crystal 78 by a tension bolt 82 having a bolt head 84 at a first end. A second end 86 is threaded and fitted with a nut 88. Bolt head 84 and nut 88 apply compression to compression plates 90 positioned next to the combined magnetostrictive pre-stress component 72 and phase change single crystal 78. Tension bolt 82 provides a static pre-stress to component 72 and crystal 78. The static pre-stress positions crystal 78 near its phase change point.

Current supplied to solenoid coil 76 increases the critical dimension of magnetostrictive material 74 and causes additional stress in crystal 78. This stress can be controlled to optimize phase change in crystal 78 in view of varying environmental conditions. Crystal 78 can then operate in the passive mode in which compression of crystal 78 causes a phase change and results in the creation of an electric field.

Figure 7:
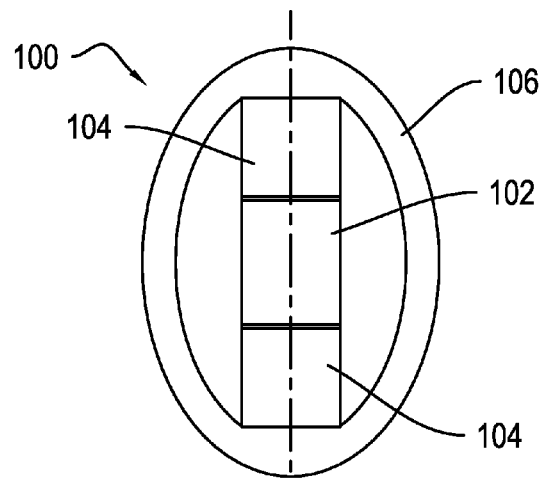
FIG. 7 is a diagram of a phase change transducer particularly configure to capture energy from temperature changes.

Another embodiment 100 given in FIG. 7 features a device wherein an increase in temperature increases stress in a crystal 102 while the increased temperature is also promoting a phase transition. Electrical contacts (not shown) are positioned on crystal 102 in either a "32" or "33" mode of operation. Crystal 102 is mounted between stress members 104 in a housing 106. Stress members have a thermal coefficient of expansion that is chosen to assist with providing stress to crystal 102 when subjected to a temperature change. As mounted, crystal 102 is subjected to a base level of pre-stress. Housing 106 has lower thermal coefficient of expansion than stress members 104 allowing housing 106 to maintain pre-stress. An increase in environmental temperature results in an expansion of stress members 104, increasing the compression of crystal 102. Increase in environmental temperature also brings the crystal 102 closer to its phase transition temperature. These temperatures can also be controlled by providing a heat source at stress members 104 and crystal 102. Electrical energy released by crystal on phase transition is received at the contacts. Thus, there could be a hybrid device for harvesting energy from both temperature changes and stress changes or for magnifying stress and temperature changes.

It will be understood that additional variations and alternatives in the details, materials, steps and arrangement of parts, which have been herein described and illustrated in order to explain the nature of the invention, may be made as understood by those skilled in the art within the principles and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A transducer for generating electrical energy from an expected external force comprising:
   a single crystal ferroelectric material having a phase transition from a ferroelectric rhombohedral phase to a ferroelectric orthorhombic phase at a predetermined stress level;
   a means for providing mechanical pre-stress joined to said single crystal ferroelectric material for providing pre-stress at a level that when combined with stress induced by the expected external force will equal the predetermined stress level; and
   at least two electrodes joined to said single crystal ferroelectric material for receiving electrical energy created by the phase transition in said single crystal ferroelectric material.

2. The device of claim 1 wherein said single crystal ferroelectric material is $Pb(B'_{1/3}Nb_{2/3})O_3$—$PbTiO_3$ where B' is one metal selected from the set of metals including Mg, Mn, Zn, and Sc.

3. The device of claim 1 wherein said single crystal ferroelectric material is ternary lead indium niobate-lead magnesium niobate-lead titanate (PIN-PMN-PT).

4. The device of claim 1 wherein said single crystal ferroelectric material is $xPb(In_{1/2}Nb_{1/2})O_3$-$(1-x-y)Pb(Mg_{1/3}Nb_{2/3})O_3$-$yPbTiO_3$ where x is greater than about 0.24 and less than about 0.33 and y is greater than about 0.28 and less than about 0.33.

5. The device of claim 1 wherein said means for applying a pre-stress includes a mechanical compression means.

6. The transducer of claim 5 wherein said mechanical compression means comprises an adjustable mechanical compression means.

7. The device of claim 6 wherein said mechanical compression means comprises:
   a first bearing plate positioned on a first side of said single crystal ferroelectric material;
   a second bearing plate positioned on a second side of said single crystal ferroelectric material;
   a tension bolt having a bolt head on a first end and a tensioning means on a second end, positionable to retain said first bearing plate and said second bearing plate against said single crystal ferroelectric material; and
   a tension adjusting means joined to said tension bolt tensioning means for placing said tension bolt in tension whereby said first bearing plate and said second bearing plate cooperate to place said single crystal ferroelectric material in compressive pre-stress.

8. The device of claim 1 wherein said pre-stress level provided by said means for applying a pre-stress is determined by the expected external force and the temperature of the single crystal ferroelectric material.

9. The device of claim 6 wherein said means for providing mechanical pre-stress comprises:
   a means for providing a base pre-stress mechanically coupled to said single crystal ferroelectric material;
   at least one environmental sensor capable of providing environmental data;

a controller joined to said environmental sensor, said controller being capable of receiving the environmental data and creating a pre-stress control signal responsive to the environmental data; and a means for adjusting pre-stress responsive to said pre-stress control signal.

10. The transducer of claim 9 wherein said at least one environmental sensor is a temperature gauge providing temperature information.

11. The transducer of claim 9 wherein said at least one environmental sensor is a pressure gauge providing pressure information.

12. The transducer of claim 9 wherein said at least one environmental sensor comprises:

a pressure gauge providing pressure information; and
a temperature gauge providing temperature information.

13. The device of claim 9 wherein said means for adjusting pre-stress comprises an electrically activated component positioned between said means for providing a base pre-stress and said single crystal ferroelectric material, said electrically activated component being capable of changing size in response to the pre-stress control signal.

14. The transducer of claim 13 wherein said electrically activated component is made from a piezoelectric ceramic material.

15. The transducer of claim 13 wherein said electrically activated component comprises:

a magnetostrictive material positioned between said means for providing a base pre-stress and said single crystal ferroelectric material; and
a coil joined to said controller and capable of establishing a magnetic circuit through said magnetostrictive material in response to the pre-stress control signal.

16. A transducer for generating electrical energy from an expected change in temperature comprising:

a single crystal ferroelectric material having a phase transition from a ferroelectric orthorhombic phase to a ferroelectric rhombohedral phase at a predetermined stress level and a predetermined temperature;
a means for providing mechanical pre-stress joined to said single crystal ferroelectric material for providing pre-stress at level that will cause the phase transition in said single crystal ferroelectric material when it is subjected to the expected change in temperature; and
at least two electrodes joined to said single crystal ferroelectric material for receiving electrical energy created by the phase transition in said single crystal ferroelectric material.

17. The device of claim 16 wherein the means for providing mechanical pre-stress includes a material having properties which subject the single crystal ferroelectric material to greater stress at increased temperatures.

18. The device of claim 16 wherein said means for providing mechanical pre-stress comprises:

a means for providing a base pre-stress mechanically coupled to said single crystal ferroelectric material;
at least one environmental sensor capable of providing environmental data;
a controller joined to said environmental sensor, said controller being capable of receiving the environmental data and creating a pre-stress control signal responsive to the environmental data; and
a means for adjusting pre-stress responsive to said pre-stress control signal.

19. A transducer for generating electrical energy from an expected change in temperature and an expected environmental force comprising:

a single crystal ferroelectric material having a phase transition from a ferroelectric orthorhombic phase to a ferroelectric rhombohedral phase at a predetermined stress level and a predetermined temperature;
a means for providing mechanical pre-stress joined to said single crystal ferroelectric material for providing pre-stress at level that will cause the phase transition in said single crystal ferroelectric material when it is subjected to one of the expected change in temperature, the expected environmental force and the combination of the expected change in temperature and the expected environmental force; and
at least two electrodes joined to said single crystal ferroelectric material for receiving electrical energy created by the phase transition in said single crystal ferroelectric material.

20. The device of claim 19 wherein said means for providing mechanical pre-stress comprises:

a means for providing a base pre-stress mechanically coupled to said single crystal ferroelectric material;
at least one environmental sensor capable of providing environmental data;
a controller joined to said environmental sensor, said controller being capable of receiving the environmental data and creating a pre-stress control signal responsive to the environmental data; and
a means for adjusting pre-stress responsive to said pre-stress control signal.

* * * * *